US012689716B2

(12) United States Patent (10) Patent No.: US 12,689,716 B2
Yamamoto et al. (45) Date of Patent: Jul. 21, 2026

(54) PROJECTOR

(71) Applicant: Panasonic Intellectual Property Management Co., Ltd., Osaka (JP)

(72) Inventors: Shota Yamamoto, Osaka (JP); Kazuhiko Nono, Osaka (JP); Daizou Seko, Mie (JP); Takaaki Gyoten, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 18/646,291

(22) Filed: Apr. 25, 2024

(65) Prior Publication Data

US 2024/0364850 A1 Oct. 31, 2024

(30) Foreign Application Priority Data

Apr. 26, 2023 (JP) ................................. 2023-072585

(51) Int. Cl.
*H04N 9/31* (2006.01)
*G01R 33/07* (2006.01)
(52) U.S. Cl.
CPC ......... *H04N 9/3155* (2013.01); *G01R 33/072* (2013.01); *H04N 9/3161* (2013.01)
(58) Field of Classification Search
CPC .. H04N 9/3155; H04N 9/3161; H04N 9/3144; H04N 9/3194; G01R 33/072; G01R 19/0092
See application file for complete search history.

(56) References Cited

U.S. PATENT DOCUMENTS

| | | | | |
|---|---|---|---|---|
| 10,976,553 B2 * | 4/2021 | Hibiya | ................... | G02B 26/10 |
| 2011/0025987 A1 * | 2/2011 | Furumi | .................. | G03B 21/16 |
| | | | | 353/121 |
| 2015/0002829 A1 | 1/2015 | Hirata et al. | | |
| 2019/0011813 A1 | 1/2019 | Sawai et al. | | |
| 2019/0258145 A1 | 8/2019 | Sawai et al. | | |
| 2021/0165310 A1 * | 6/2021 | Tsao | ..................... | G02B 26/008 |

FOREIGN PATENT DOCUMENTS

| | | | | | |
|---|---|---|---|---|---|
| CN | 101170858 A | * | 4/2008 | ............. | H05B 45/10 |
| JP | 2004303511 A | * | 10/2004 | | |
| JP | 2007-102008 | | 4/2007 | | |
| JP | 2007-172876 | | 7/2007 | | |
| JP | 2009-512120 | | 3/2009 | | |
| JP | 5836404 | | 12/2015 | | |
| JP | 2019-15789 | | 1/2019 | | |
| WO | 2007/049358 | | 5/2007 | | |

* cited by examiner

*Primary Examiner* — Michael Lee
(74) *Attorney, Agent, or Firm* — Wenderoth, Lind & Ponack L.L.P.

(57) ABSTRACT

Provided is a projector configured to modulate light from a light source unit and project image light, the projector including: a current measurement unit that measures a current supplied from a power supply, the current including at least a current supplied to the light source unit of the projector; and a controller that compares a measured current value measured by the current measurement unit with limit value information determined by user input or based on data stored in advance, and controls power output to the light source unit in accordance with a comparison result.

9 Claims, 9 Drawing Sheets

PROJECTOR

BACKGROUND

1. Technical Field

The present invention relates to a projector.

2. Description of the Related Art

Some of conventional projectors are configured to modulate illumination light from a light source into image light using a light modulation element and project the image light modulated. As the light modulation element, a digital micromirror device (DMD) is used. This kind of projector is used in various places, whether indoors or outdoors.

Examples of this kind of projector include a projector disclosed in JP 2019-15789 A. This kind of projector is restricted in a current value, which can be used, due to restriction of a power plug.

For example, when the projector is used at a low input voltage, a current value of a current flowing through the power plug increases compared to a normal case. The current value is restricted in a conventional technique by performing output control of the light source in accordance with an input voltage of the projector. However, when the projector is used for projection mapping outdoors, for example, the projector may be used using a power supply line with a length of several tens of meters from a power supply. This case causes a voltage drop in the power supply line to be increased as compared to indoor use. Then, the projector restricts its output more than necessary, and thus is used at a luminance lower than that to be originally output.

The output control in accordance with an input voltage causes an input current to be acquired from a calculated value, an experimental value, or the like, so that a margin for a current variation is typically secured. In accordance with the margin secured, light emitted from the light source may be more reduced in power.

SUMMARY OF THE INVENTION

It is an object of the present disclosure to provide a projector with improved utilization efficiency of power that is originally available.

A projector according to the present disclosure is configured to modulate light from a light source unit and project image light, and includes: a current measurement unit that measures a current supplied from a power supply, the current including at least a current supplied to the light source unit of the projector; and a controller that compares a measured current value measured by the current measurement unit with limit value information determined by user input or based on data stored in advance, and controls power output to the light source unit in accordance with a comparison result.

The present disclosure can provide a projector with improved utilization efficiency of power that is originally available.

BRIEF DESCRIPTION OF THE DRAWINGS

FIG. 1 is a diagram illustrating a general configuration of a projector according to a first exemplary embodiment;

FIG. 2 is a block diagram illustrating a power supply line to each component of the projector according to the first exemplary embodiment;

FIG. 9A is a block diagram illustrating a power supply line to each component of the projector according to a second exemplary embodiment;

DETAILED DESCRIPTIONS

Figure 3:
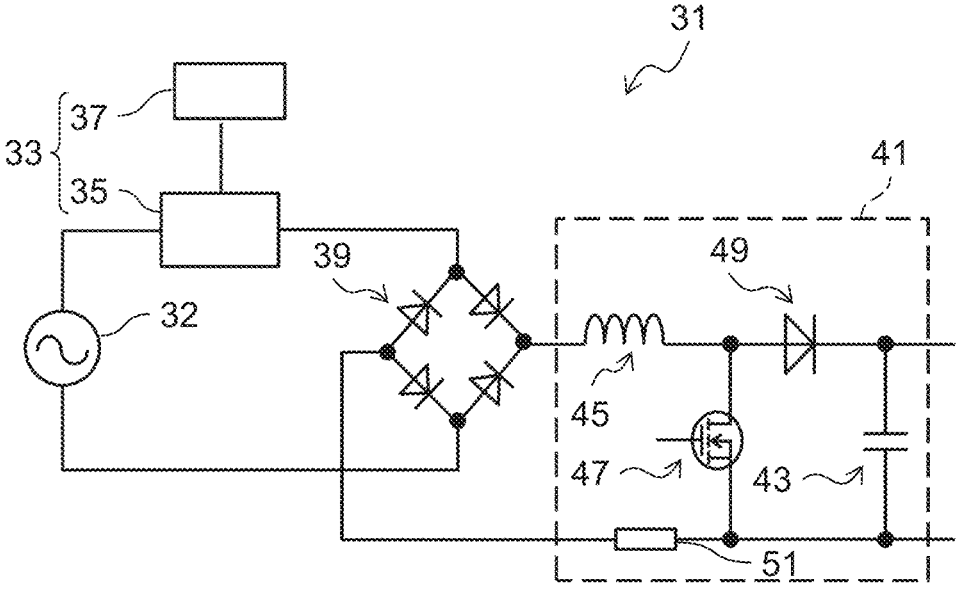
FIG. 3 is a circuit diagram illustrating an example of a circuit configuration of a power supply circuit.

Exemplary embodiments will be described in detail below with reference to the drawings as appropriate. However, detailed description more than necessary may not be described. For example, detailed description of well-known matters and duplicated description of a substantially identical configuration may not be described. This is to avoid an unnecessarily redundant description below and to facilitate understanding of those skilled in the art.

The accompanying drawings and the following description are provided for those skilled in the art to fully understand the present disclosure, and are not intended to limit the subject matter described in the scope of claims.

First Exemplary Embodiment 1-1. Configuration of Projector

Figure 1:
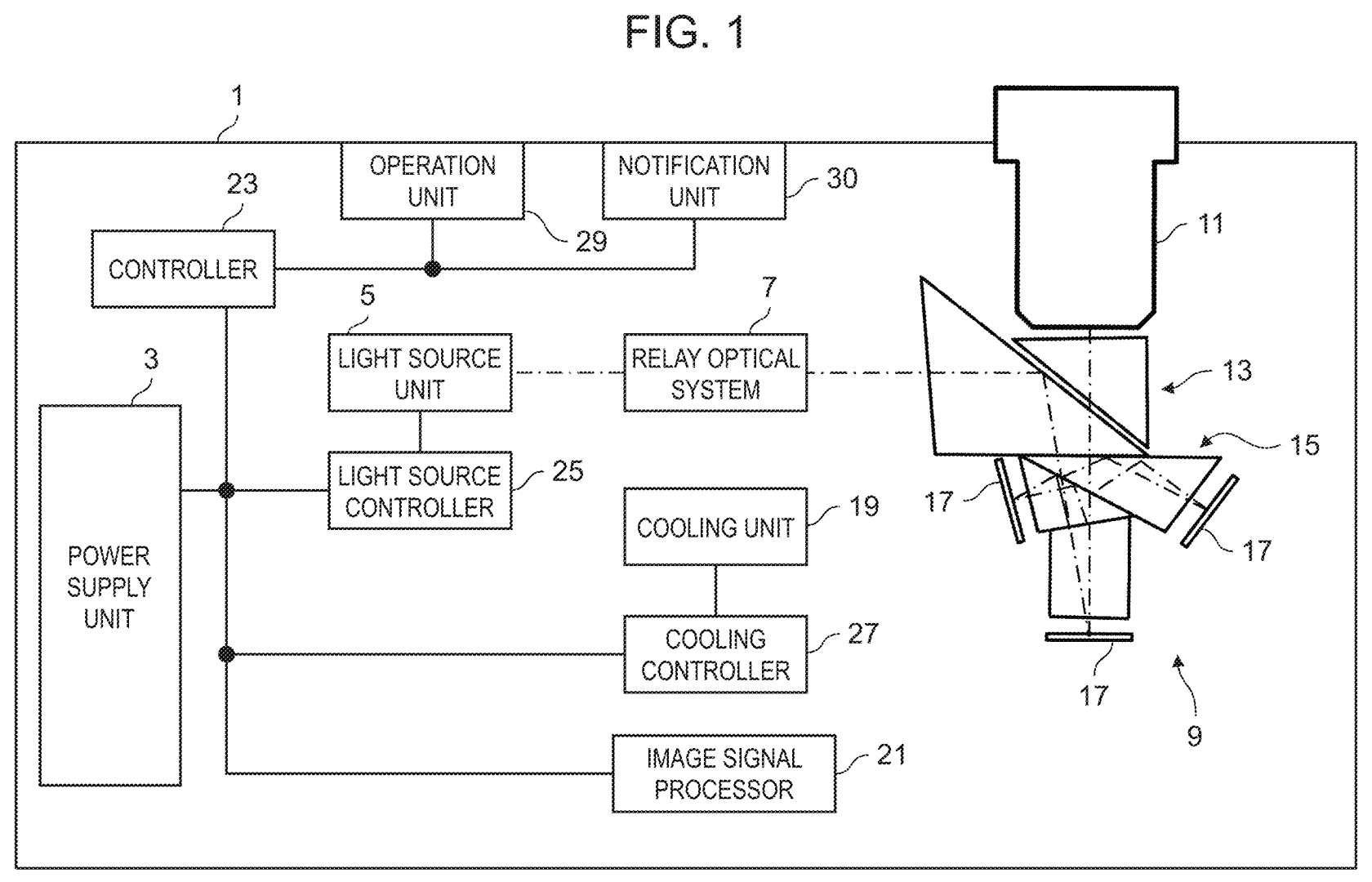

Projector 1 according to a first exemplary embodiment will be described with reference to FIG. 1. FIG. 1 is a diagram illustrating a general configuration of projector 1 according to the first exemplary embodiment. Projector 1 according to the first exemplary embodiment is a so-called three-chip DMD projector using three DMDs, for example. In the following description, alternating current may be referred to as AC, and direct current may be referred to as DC.

Projector 1 according to the first exemplary embodiment includes power supply unit 3, light source unit 5, relay optical system 7, light modulation unit 9, and projection lens 11.

Power supply unit 3 converts power supplied from an AC (alternating current) power supply into DC, and supplies drive power for projector 1.

Light source unit 5 includes a plurality of laser light sources and a phosphor wheel, for example. The plurality of laser light sources emits laser beams in a blue wavelength region that are branched and incident on the phosphor wheel, and that are converted into laser beams in a yellow wavelength region. The laser beams in the yellow wavelength region and the laser beams in the blue wavelength region are mixed to generate white light, and the white light is emitted from light source unit 5 to relay optical system 7.

Relay optical system 7 includes a plurality of lenses and mirrors, and guides the white light emitted from light source unit 5 to light modulation unit 9.

Light modulation unit 9 modulates the incident white light to generate image light, and emits the image light to projection lens 11. Light modulation unit 9 includes total reflection prism 13, color prism 15, and light modulation element 17. Total reflection prism 13 includes two prisms to allows the white light incident from relay optical system 7 to be incident on a minute gap between the two prisms at an angle equal to or larger than a total reflection angle, and to be reflected to change its traveling direction to travel to color prism 15.

Color prism 15 divides the incident white light into red light, green light, and blue light, and causes the light of each color to be incident on corresponding one of three light modulation elements 17 that modulate the light of the respective colors. The red light, green light, and blue light, which are modulated by light modulation element 17, are integrated by color prism 15, and pass through total reflection prism 13 as image light, and then are emitted to projection lens 11.

Light modulation element 17 emits light while changing a traveling direction of the light in response to a signal from image signal processor 21, the signal being synchronized with the light of each color. Light modulation element 17 is a DMD that changes a traveling direction of light by changing an angle of a micromirror, for example.

Projection lens 11 includes a plurality of lenses, and magnifies and projects the image light incident from light modulation unit 9 onto a screen (not illustrated).

Projector 1 further includes cooling unit 19, image signal processor 21, controller 23, light source controller 25, cooling controller 27, operation unit 29, and notification unit 30.

Cooling unit 19 cools power supply unit 3, light source unit 5, light modulation element 17, light modulation unit 9, each controller, and the like. Cooling unit 19 includes a fan that feeds cooling air to light modulation unit 9, a liquid-cooling pump that circulates a refrigerant that transfers heat in light modulation unit 9 to the outside, and a Peltier element that cools light source unit 5, for example.

Image signal processor 21 drives and controls an angle of a micromirror of each light modulation element 17 to a first angle and a second angle in synchronization with the input image signal. Light reflected at the first angle is incident on color prism 15 as image light, and light reflected at the second angle is absorbed as unnecessary light.

Controller 23 has a function of adjusting light source controller 25 and cooling controller 27 based on power information supplied from power supply unit 3.

Light source controller 25 performs control based on an adjustment value instructed from controller 23, and adjusts power supplied from power supply unit 3 to supply the adjusted power to light source unit 5. About 76% of power supplied to projector 1 is supplied to light source unit 5.

Cooling controller 27 performs control based on an adjustment value instructed from controller 23, and adjusts power supplied from power supply unit 3 to supply the adjusted power to cooling unit 19. About 17% of the power supplied to projector 1 is supplied to cooling unit 19.

Each of image signal processor 21, controller 23, light source controller 25, and cooling controller 27 includes an integrated circuit that can be implemented by a semiconductor element or the like, and that can be composed of a microcomputer, a CPU, an MPU, a GPU, a DSP, an FPGA, or an ASIC, for example. Each of image signal processor 21, controller 23, light source controller 25, and cooling controller 27 reads data and programs stored in a built-in storage unit (not illustrated) and performs various kinds of arithmetic processing, thereby implementing a predetermined function. The storage unit can be implemented by a hard disk (HDD), a solid state drive (SSD), a random access memory (RAM), a dynamic random access memory (DRAM), a ferroelectric memory, a flash memory, a magnetic disk, or a combination thereof, for example.

Operation unit 29 receives an operation instruction from a user and outputs an operation signal to controller 23. Operation unit 29 is composed of at least one of a touch panel display, a button, a remote controller, a mobile terminal, and a remote terminal using a network. The user inputs a limit value of working current or a limit value of power consumption from operation unit 29.

Notification unit 30 notifies the user of an operation status of projector 1 by display of a character and an image using a display, notification using a network, or voice using a speaker. Operation unit 29 and notification unit 30 may be integrally formed, and can be implemented by a touch display or a mobile terminal. Notification unit 30 notifies the user of power consumption of projector 1, for example.

1-2. Configuration of Current Control

Figure 2:
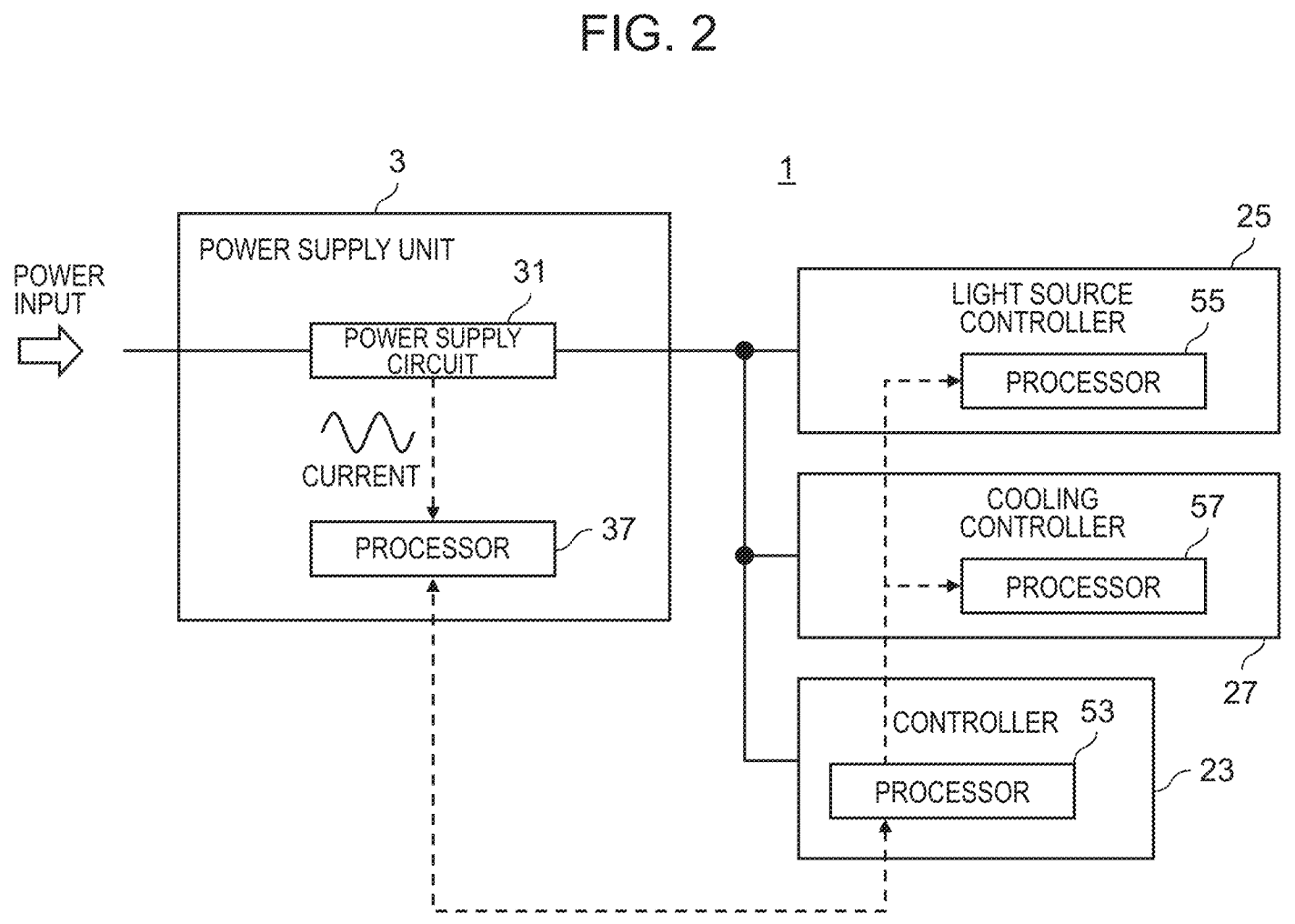

Next, current control of projector 1 according to the first exemplary embodiment will be described with reference to FIGS. 2 and 3. FIG. 2 is a block diagram illustrating a power supply line to each component of the projector according to the first exemplary embodiment. FIG. 3 is a circuit diagram illustrating an example of a circuit configuration of power supply circuit 31.

For example, power supply unit 3 receives an AC (alternating current) input voltage through an AC plug inserted into power supply 32 that is the AC power supply. Power supply unit 3 includes power supply circuit 31 that converts the supplied AC power into predetermined DC power, and processor 37 that calculates an effective value of a current flowing through power supply circuit 31.

Power supply circuit 31 includes current measurement unit 33 that measures a current value of input power supplied to power supply unit 3, rectifier 39 that rectifies an AC voltage supplied to power supply unit 3, and power factor correction (PFC) circuit 41 that is a power factor improvement circuit.

Current measurement unit 33 measures a current supplied from power supply 32, the current including at least a current supplied to light source unit 5 of projector 1. Current measurement unit 33 measures an alternating current supplied from power supply 32, for example. Current measurement unit 33 is composed of Hall sensor 35, and processor 37 that calculates a current value from a detection value detected by Hall sensor 35.

Processor 37 samples a current waveform from a voltage detection value of Hall sensor 35 and calculates a current effective value. The calculated current effective value is output to controller 23.

Rectifier 39 includes four rectifier diodes, and performs full-wave rectification on a supplied sinusoidal input voltage and a supplied sinusoidal input current.

PFC circuit 41 brings a power factor of input power close to 1. PFC circuit 41 includes coil 45, switching element 47, diode 49, detection resistor 51, and smoothing capacitor 43. Switching element 47 is a metal-oxide-semiconductor field-effect transistor (MOSFET), for example.

Smoothing capacitor 43 also has a function of moderating fluctuation of converted DC power.

As illustrated in FIG. 2, DC power output from power supply circuit 31 is supplied to controller 23, light source controller 25, and cooling controller 27. FIG. 2 indicates a power line with a solid line passing through power supply circuit 31.

Controller 23 includes processor 53. Processor 53 includes a storage unit composed of a memory and the like, and the storage unit stores a setting value. Processor 53 compares a received actual measured current value with the setting value.

Light source controller 25 includes processor 55 that controls power to be supplied to light source unit 5.

Cooling controller 27 includes processor 57 that controls power to be supplied to cooling unit 19.

Processors 37, 53, 55, 57 each may be composed of a microcomputer, a central processing unit (CPU), a microprocessor unit (MPU), a graphics processor unit (GPU), a digital signal processor (DSP), a field-programmable gate array (FPGA), or an application specific integrated circuit (ASIC), for example. FIG. 2 indicates communication lines with broken lines connected to processors 37, 53, 55, 57, and not only processors 37 and 53, but also processors 53, 55, and 57 are communicably connected to each other.

Figure 4:
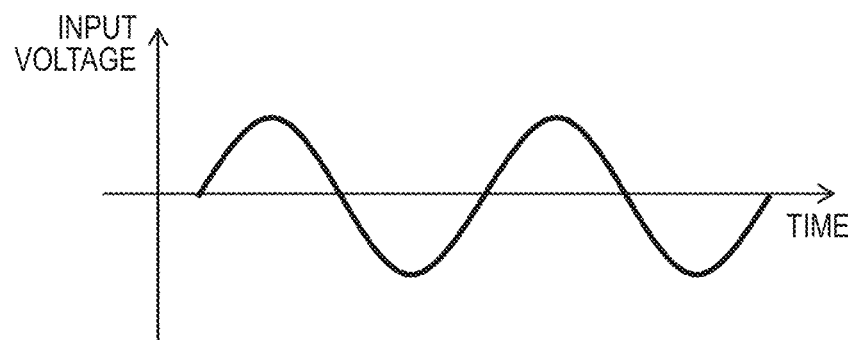
FIG. 4 is a diagram illustrating a waveform of an input voltage supplied to a power supply circuit.

When an input voltage is detected in the prior art, the input voltage supplied from power supply 32 is a sinusoidal AC voltage as illustrated in FIG. 4, for example. Thus, a peak value of the input voltage or an effective value thereof may be detected. Either the detected peak value or the detected effective value enables power control to be performed with high accuracy.

Figure 5:
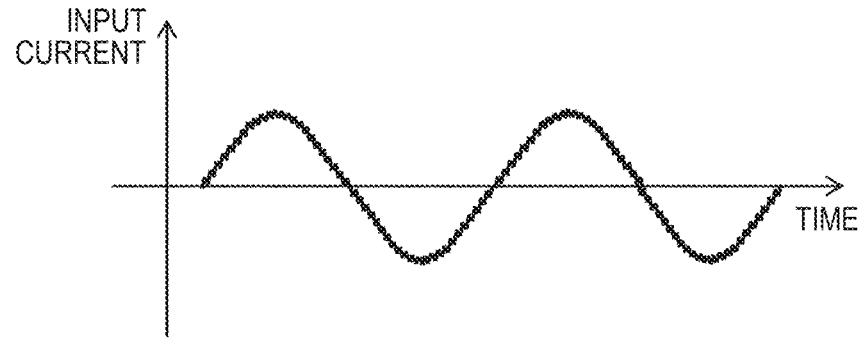
FIG. 5 is a diagram illustrating a waveform of an input current with a power factor improved by a PFC circuit.

However, even when PFC circuit 41 brings a power factor of an input current supplied from power supply 32 close to 1, the input current does not have a complete sinusoidal shape as illustrated in FIG. 5. Thus, calculation of the effective value from the peak value of the input current deteriorates in accuracy. Current measurement unit 33 is capable of detecting the effective value of the input current with high accuracy by sampling and calculating a waveform of the input current.

For example, the United States requires an AC plug to be used with a current of 80% or less of a plug rating of the AC plug. For example, when a 15 A plug is used, an upper limit of the input current should be limited to 12 A. Control of estimating the input current and the input power from the input voltage causes the input current and the input power to be estimated based on the detected input voltage using a table of the corresponding input current and input power measured in advance.

Figure 6:
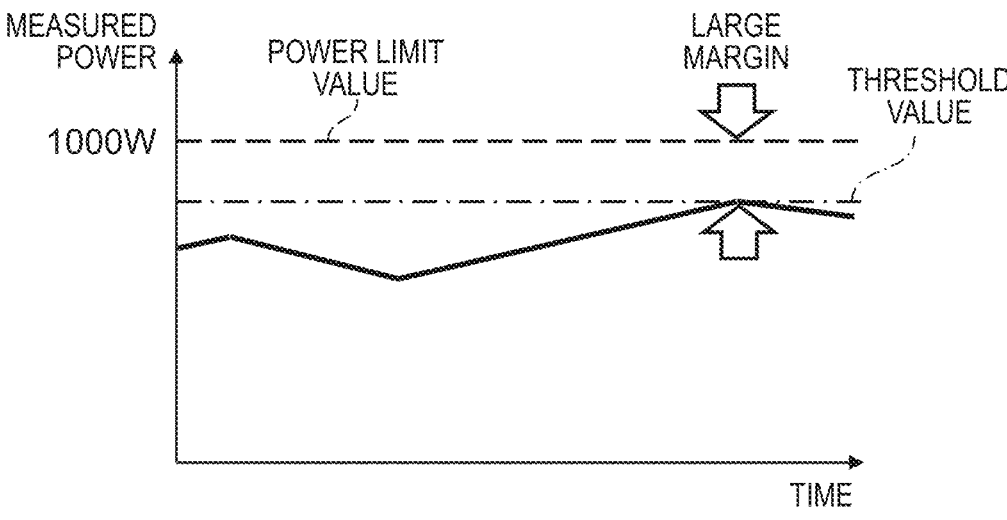
FIG. 6 is a graph illustrating power control in a comparative example.
Figure 7:
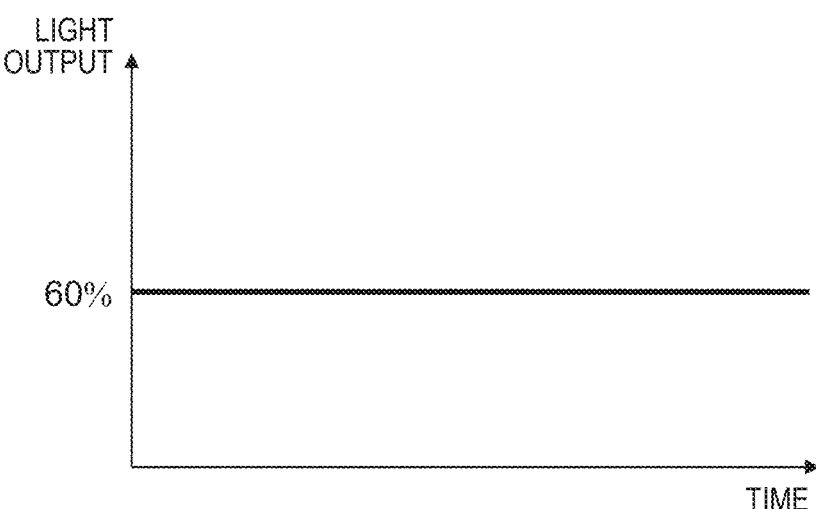
FIG. 7 is a graph illustrating light output from a light source unit in a comparative example.

As described above, the input current and the input power cannot be accurately detected, and thus requiring an increase in a margin between a limit value of the input power and a threshold value actually set not exceeding the limit value as illustrated in FIG. 6. This threshold value causes an input current actually used to have a low upper limit value, and input power to light source unit 5 to be suppressed low with a large margin with respect to a value of rated power supply, so that light output from light source unit 5 is suppressed low as illustrated in FIG. 7. FIG. 7 shows the light output that is suppressed to 60%, for example.

Figure 8:
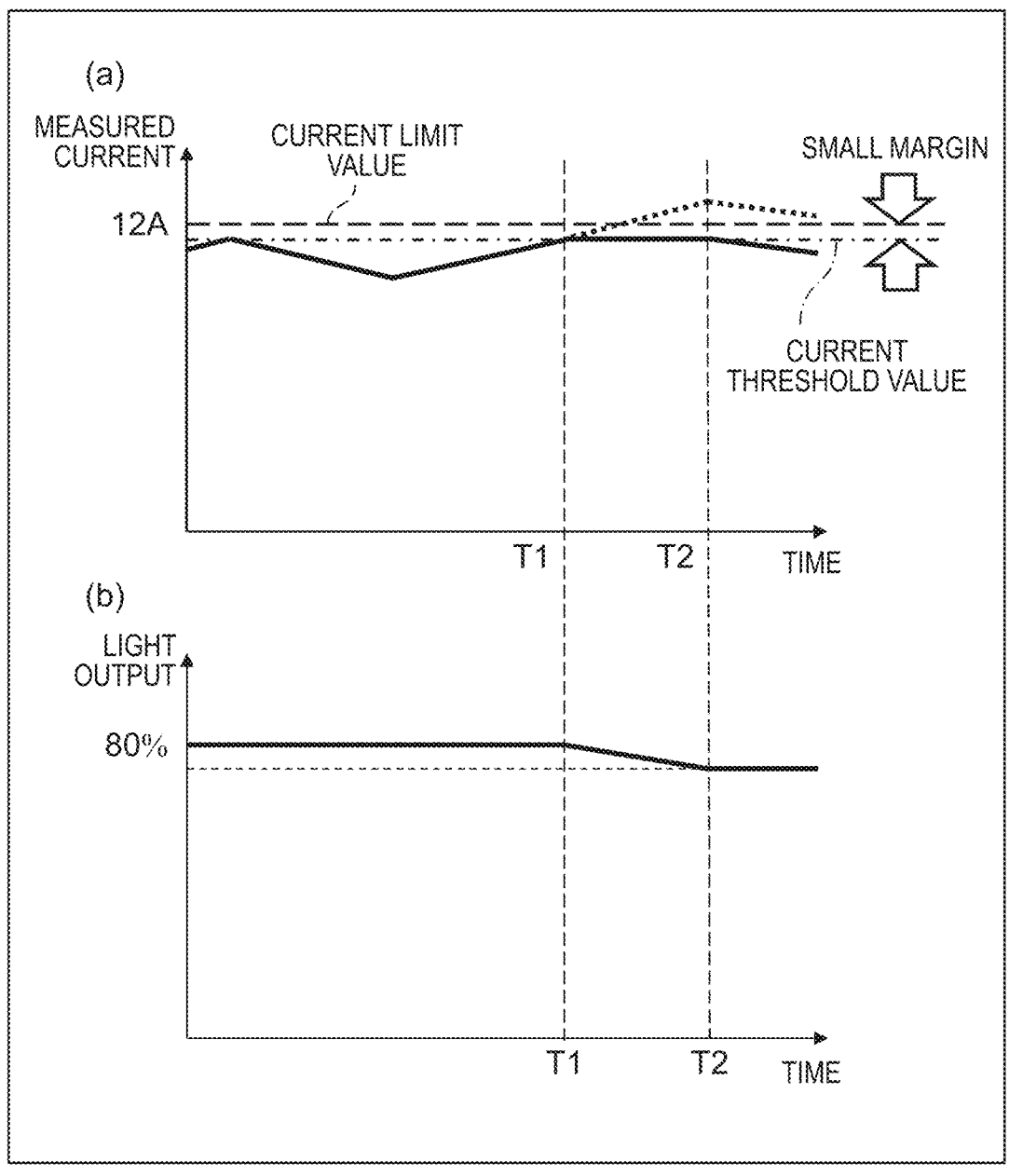
FIG. 8 is a graph illustrating current control and light output from a light source unit according to the first exemplary embodiment.

In contrast, projector 1 according to the first exemplary embodiment enables power supply unit 3 to directly detect an input current, and thus enables reducing a margin between a limit value based on the plug rating of the AC plug and a threshold value actually set not exceeding the limit value as illustrated in part (a) of FIG. 8. This threshold value enables an input current actually used to have an upper limit value close to a current limit value, and input power to light source unit 5 to be close to an upper limit value, so that the light output from light source unit 5 can be increased to more than when the input current is estimated from the input power, as illustrated in part (b) of FIG. 8. Part (b) of FIG. 8 shows the light output that is output at 80%, for example.

Current control in each controller will be described with reference to FIG. 2. Processor 37 of power supply unit 3 performs current waveform sampling based on a detection value of Hall sensor 35, and calculates a current effective value supplied to power supply unit 3. Processor 37 of power supply unit 3 transmits the calculated current effective value to processor 53 of controller 23.

Processor 53 of controller 23 stores a current threshold value for determining whether to perform current limitation. The current threshold value may be a value stored in advance, or may be a value instructed by the user from operation unit 29. Processor 53 compares the received current effective value with the current threshold value. When the received current effective value is smaller than the current threshold value, the comparison between the received current effective value and the current threshold value is continued. When the received current effective value is larger than the current threshold value, processor 53 instructs processor 55 of light source controller 25 and processor 57 of cooling controller 27 to reduce power to be output.

Light source controller 25 limits a light source current of light source unit 5 to reduce power to be output upon receiving an instruction to reduce power output from controller 23, thereby limiting an input current necessary for light source unit 5. This limitation reduces brightness of light emitted from light source unit 5.

Cooling controller 27 reduces power output to cooling unit 19 to limit a drive current of each cooling device upon receiving an instruction to reduce power output from controller 23. Cooling controller 27 reduces rotational speed of the fan to reduce output of the liquid-cooling pump, thereby reducing a drive current of the Peltier element to limit the drive current of each cooling device, for example.

Examples of a control method for reducing power output from each of light source controller 25 and cooling controller 27 include reducing an amplitude of current output or reducing a duty ratio of PWM control.

Alternatively, power output from only light source controller 25 may be reduced instead of reducing power output from both light source controller 25 and cooling controller 27.

The current control described above will be described with reference to FIG. 8. As illustrated in part (a) of FIG. 8, when processor 37 of power supply unit 3 determines that a measured current exceeds the current threshold value at time T1, light source controller 25 and cooling controller 27 reduce output power therefrom. As a result, although an input current to power supply unit 3 decreases, processor 53 compares a received current effective value with the current threshold value again to determine whether the input current is smaller than the current threshold value. Feedback control is continued as described above to constantly monitor an input current to power supply unit 3 to prevent the input current from exceeding the current threshold value. When a measured current exceeds the current threshold value at time T1 and light source controller 25 receives an instruction to reduce power output from controller 23 once, light source controller 25 continues to reduce light output for a certain period of time even after time T2 at which the input current to power supply unit 3 is reduced to a value not exceeding the current threshold value. This certain period of time is several ten seconds to several minutes, for example. As a result, increase and decrease of the light output by the feedback control can be reduced, so that image light can be prevented from flickering.

1-3. Effects and the Like

As described above, projector 1 according to the first exemplary embodiment is configured to project image light generated by modulating light from light source unit 5, and includes: current measurement unit 33 that measures a current supplied from power supply 32, the current including at least a current supplied to light source unit 5 of projector 1; and controller 23 that compares a measured current value measured by current measurement unit 33 with limit value information determined by user input or based on data stored in advance, and controls power output to light source unit 5 in accordance with a comparison result.

Measuring a current on an input side of projector 1 enables reducing a margin between a rated current and a drive current, so that a drive current of light source unit 5 can be increased as much as possible, and utilization efficiency of power supplied to projector 1 can be increased.

The limit value information is the current threshold value, so that a margin with respect to a rated current of the AC plug can be reduced, and thus the drive current of light source unit 5 can be increased.

After performing control to reduce power output on light source unit 5, light source controller 25 does not perform control to increase the power output on light source unit 5 until a certain period elapses. As a result, light emitted from light source unit 5 can be prevented from flickering, so that image light projected from projector 1 can be prevented from flickering.

Second Exemplary Embodiment

Figure 9A:
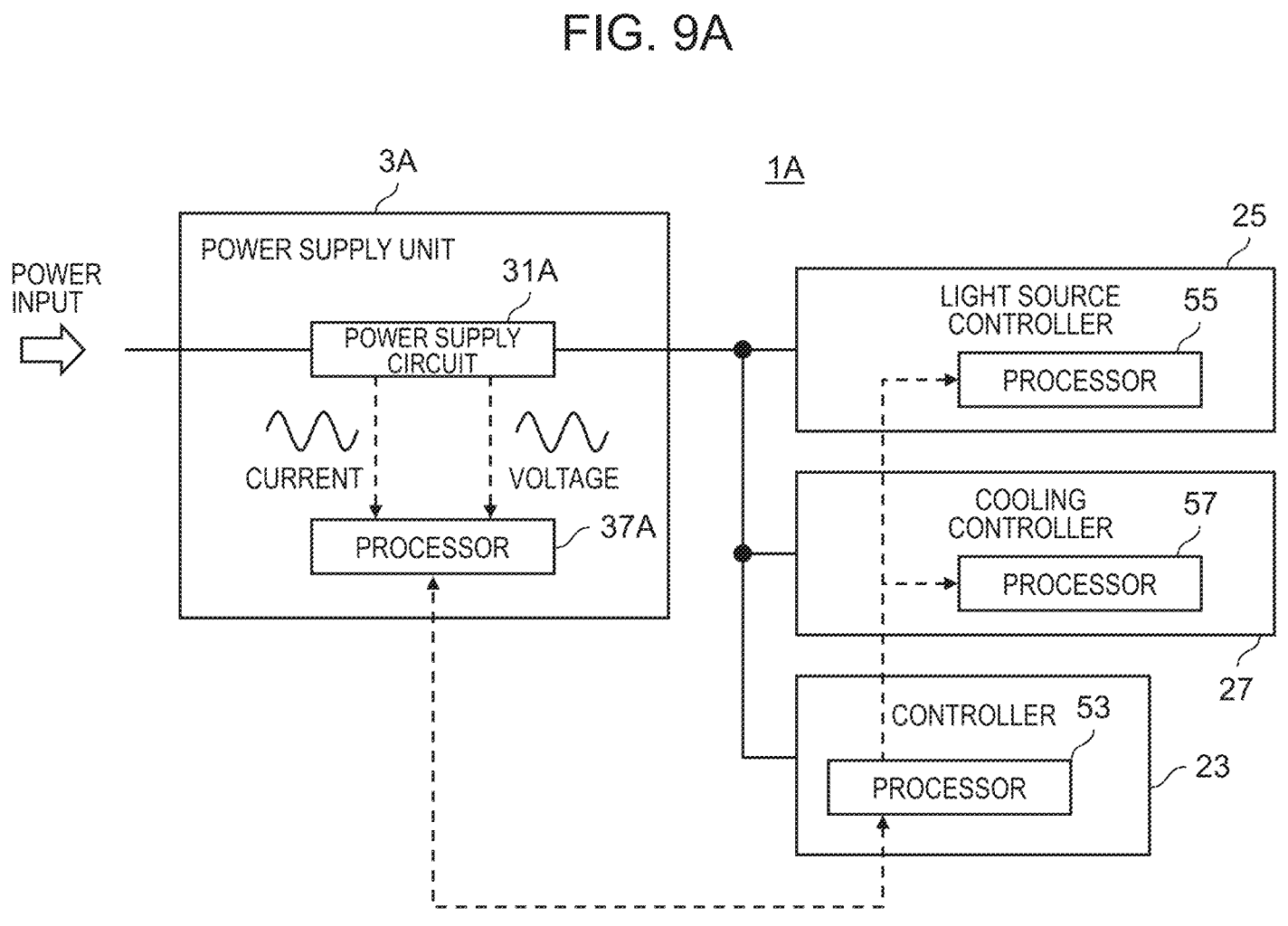
Figure 9B:
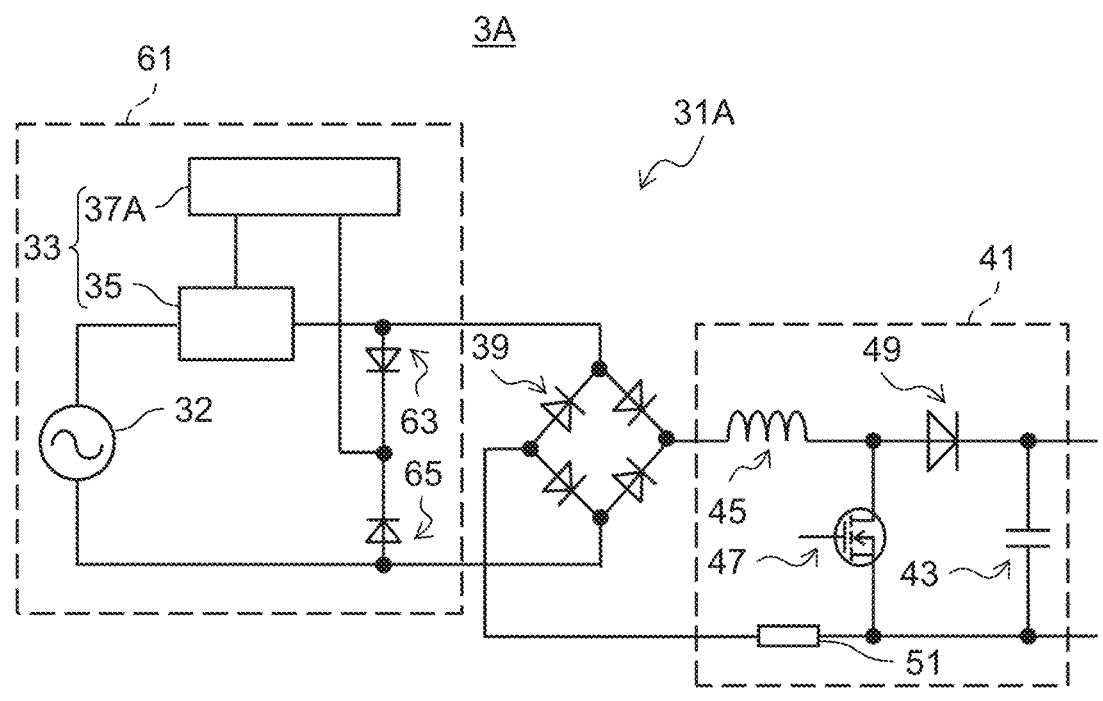
FIG. 9B is a circuit diagram illustrating an example of a circuit configuration of a power supply circuit according to the second exemplary embodiment.

Next, projector 1A according to a second exemplary embodiment will be described with reference to FIGS. 9A and 9B. FIG. 9A is a block diagram illustrating a power supply line to each component of projector 1A according to the second exemplary embodiment. FIG. 9B is a circuit diagram illustrating an example of a circuit configuration of a power supply circuit according to the second exemplary embodiment.

Although power supply unit 3 of the first exemplary embodiment detects an input current, power supply unit 3A of the second exemplary embodiment detects not only the input current but also an input voltage. Configuration other than this point and points described below is common between projector 1 according to the first exemplary embodiment and projector 1A according to the second exemplary embodiment, so that the common configuration will not be described.

Power supply circuit 31A of power supply unit 3A of the second exemplary embodiment includes voltage measurement unit 61, and a detected voltage value is transmitted to processor 37A together with a current value detected by current measurement unit 33. Voltage measurement unit 61 performs peak hold or sampling of a voltage waveform of an input voltage to calculate a voltage effective value. Voltage measurement unit 61 is composed of current measurement unit 33 and two rectifier elements 63, 65, and processor 37A calculates the voltage effective value.

As in the first exemplary embodiment, processor 37A also performs waveform sampling of a current to calculate a current effective value. Thus, when processor 37A acquires waveforms of both the input current and the input voltage by sampling, active power [W], which is power obtained by averaging one cycle of instantaneous power, can be calculated, and thus a power factor can be calculated.

The active power calculated by processor 37A of power supply unit 3A is transmitted to processor 53 of controller 23. Processor 53 of controller 23 controls power output from light source controller 25 and cooling controller 27 by comparing power with a power threshold value as limit value information instead of the current control of the first exemplary embodiment.

Figure 10:
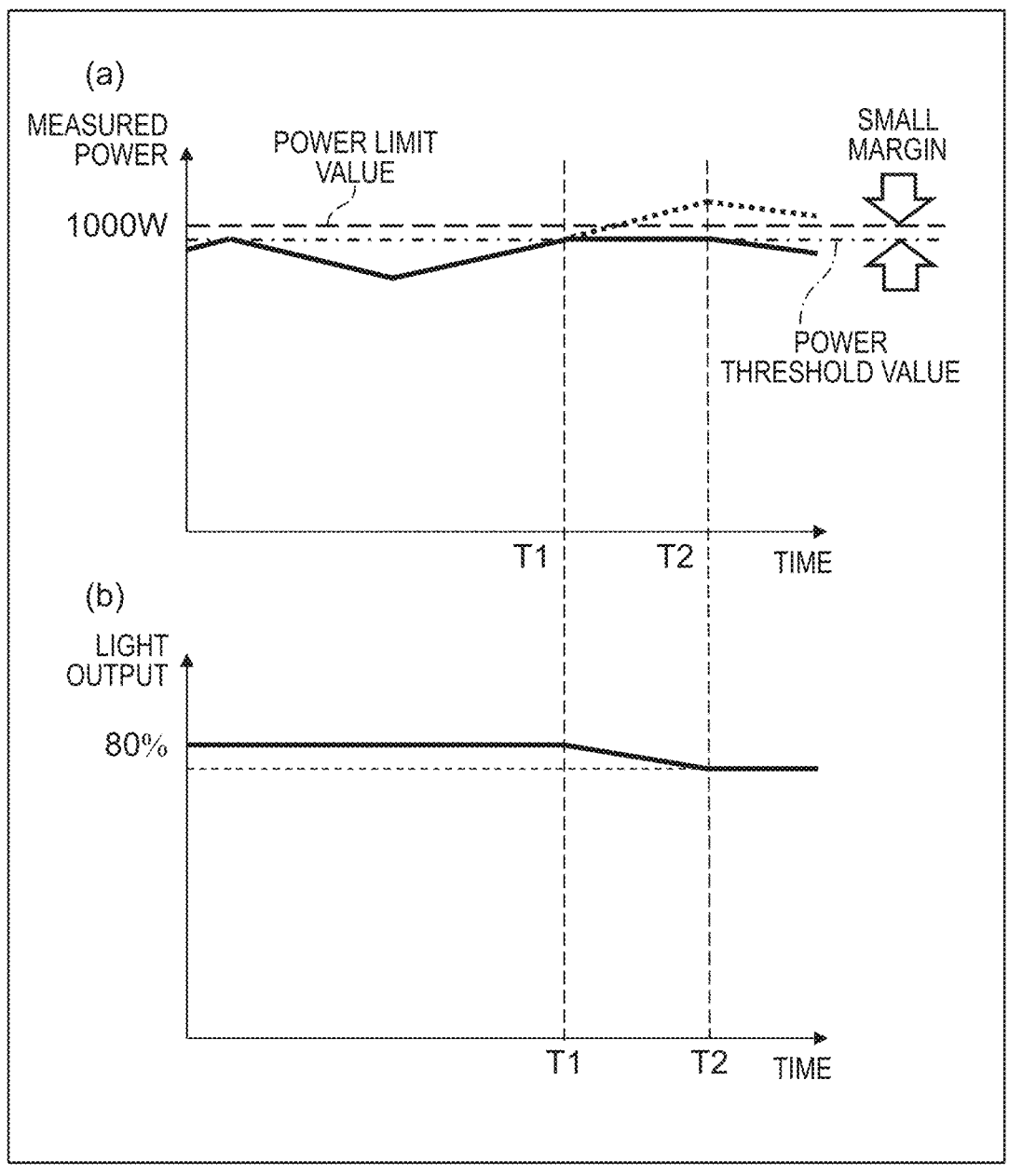
FIG. 10 is a graph illustrating power control and light output from a light source unit according to the second exemplary embodiment.

Projector 1A according to the second exemplary embodiment enables power supply unit 3 to directly detect input power, and thus enables reducing a margin between a power consumption limit value of projector 1A and a power threshold value actually set not exceeding the limit value as illustrated in part (a) of FIG. 10. This threshold value enables input power actually used to have an upper limit value close to a power limit value, and input power to light source unit 5 to be close to an upper limit value, so that the light output from light source unit 5 can be increased to more than when the input power is estimated, as illustrated in part (b) of FIG. 10. Part (b) of FIG. 10 shows the light output that is output at 80%, for example.

Power control in each controller will be described with reference to FIG. 9A. Processor 37A of power supply unit 3A performs current waveform sampling based on a detection value of Hall sensor 35, and calculates a current effective value supplied to power supply unit 3A. Processor 37A of power supply unit 3A performs voltage waveform sampling based on a measurement result of the voltage measurement unit, and calculates an effective voltage value supplied to power supply unit 3A. Processor 37A of power supply unit 3A calculates active power based on the calculated current effective value and voltage effective value, and transmits the calculated active power to processor 53 of controller 23.

Processor 53 of controller 23 stores a power threshold value for determining whether to perform power limitation. Processor 53 compares the received active power with the power threshold value. When the received active power is less than the power threshold value, processor 53 continues to compare the received active power with the power threshold value. When the received active power is larger than the power threshold value, processor 53 instructs processor 55 of light source controller 25 and processor 57 of cooling controller 27 to reduce power output.

Light source controller 25 reduce power to be output to light source unit 5 to limit light source power upon receiving an instruction to reduce power output from controller 23. This limitation reduces brightness of light emitted from light source unit 5. Cooling controller 27 reduces power output to cooling unit 19 to limit drive power of each cooling device upon receiving an instruction to reduce power output from controller 23. Alternatively, power output from only light source controller 25 may be reduced instead of reducing power output from both light source controller 25 and cooling controller 27.

As illustrated in part (a) of FIG. 8, when processor 37A of power supply unit 3A determines that active power exceeds the threshold value at time T1, light source controller 25 and cooling controller 27 reduce output power therefrom. As a result, although input power to power supply unit 3A decreases, processor 53 compares received active power with the power threshold value again to determine whether the input power is smaller than the power threshold value. Feedback control is continued as described above to constantly monitor input power to power supply unit 3 to prevent the input power from exceeding the power threshold value.

When active power exceeds the power threshold value at time T1 and light source controller 25 receives an instruction to reduce power output from controller 23 once, light source controller 25 continues to reduce light output for a certain period of time even after time T2 at which the input current to power supply unit 3A is reduced to a value not exceeding the current threshold value. This certain period of time is several minutes, for example. As a result, increase and decrease of the light output by the feedback control can be reduced, so that image light can be prevented from flickering.

Processor 53 also notifies a user of active power, or power consumption, from notification unit 30, so that the user can recognize the power consumption of projector 1A, and can estimate an electric bill due to use of projector 1A.

As described above, projector 1A in the second exemplary embodiment includes voltage measurement unit 61 that measures voltage supplied to projector 1A from a power supply. Then, the limit value information is a power threshold value, and processor 37A calculates power of projector 1A from a measured current value and a measured voltage value measured by voltage measurement unit 61. Controller 23 compares the calculated power with the power threshold value, and light source controller 25 controls voltage output to light source unit 5 in accordance with a comparison result.

As a result, measuring a current and voltage on an input side of projector 1A enables reducing a margin between rated power and drive power, so that drive power of light source unit 5 can be increased as much as possible, and utilization efficiency of power supplied to projector 1A can be increased.

Processor 37A also determines a power factor based on the measured current value and the measured voltage value, and calculates active power of projector 1A based on the power factor, the measured current value, and the measured voltage value. Calculating the active power of projector 1A enables notifying the user of the power consumption of projector 1A, for example.

Processor 37A may calculate apparent power instead of calculating the active power, and compare the calculated apparent power with the power threshold value, and then control voltage output to light source unit 5 in accordance with a comparison result.

Other Exemplary Embodiments

As described above, the exemplary embodiment has been described to exemplify the techniques in the present disclosure. For this description, the accompanying drawings and the detailed descriptions have been provided. Thus, components described in the accompanying drawings and the detailed description may include not only components essential for solving the problem, but also components non-essential for solving the problem to illustrate the above techniques. For this reason, it should not be immediately recognized that these non-essential components are essential just because these non-essential components are described in the accompanying drawings and the detailed description.

Figure 11:
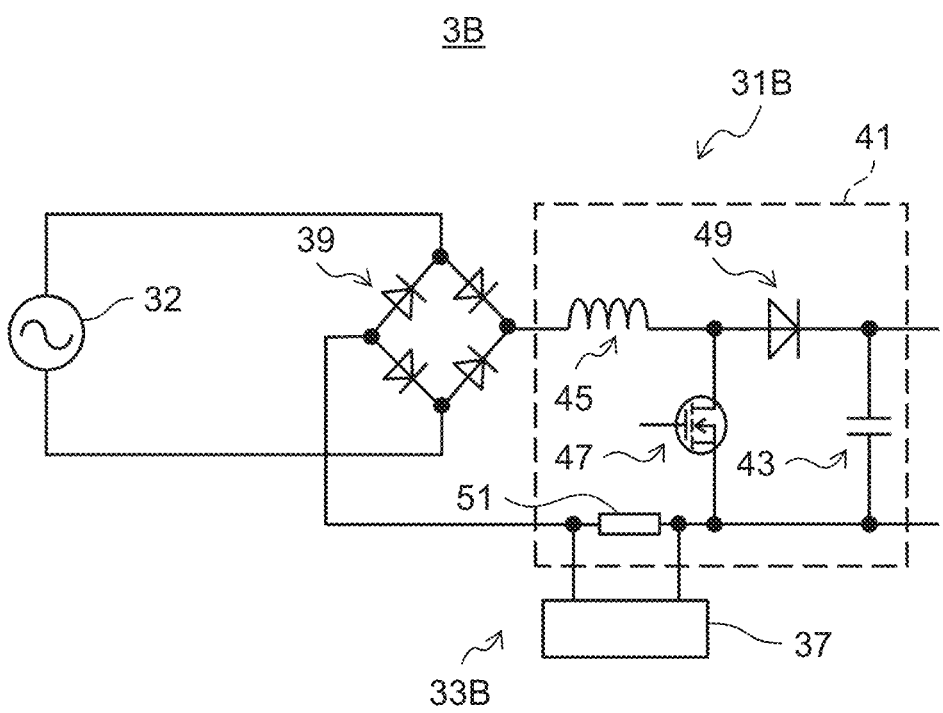
FIG. 11 is a circuit diagram illustrating an example of a circuit configuration of a power supply circuit according to a modification.

(1) Although current measurement unit 33 is disposed upstream of rectifier 39 composed of a rectification diode in each of the exemplary embodiments described above, the present invention is not limited thereto. As illustrated in FIG. 11, current measurement unit 33B of power supply circuit 31B may be disposed between rectifier 39 and smoothing capacitor 43. For example, current measurement unit 33B may be composed of resistor 51 disposed between rectifier 39 and smoothing capacitor 43, and processor 37 that detects a voltage value across resistor 51.

(2) Although power supply unit 3, 3A, 3B detects an input current or input power in each of the exemplary embodiments described above, the present invention is not limited thereto. Light source unit 5 uses power that is about 76% of power used in the whole of projector 1, so that an input current or input power supplied to light source controller 25 may be detected, and controller 23 may adjust an output current or output power to be output from light source controller 25 and cooling controller 27 based on the amount of the detection. Not only the input current or the input power supplied to light source controller 25, but also an input current or input power supplied to cooling controller 27 may be detected. Light source unit 5 and cooling unit 19 use power that is about 93% of the power used in the whole of projector 1, so that utilization efficiency of a current or power for driving light source unit 5 and cooling unit 19 can be increased more accurately.

(3) Although power supply unit 3, 3A, 3B in each of the exemplary embodiments described above is supplied with power from the AC power supply, the present invention is not limited thereto. Power supply unit 3, 3A, 3B may be supplied with power from a DC power supply such as a battery.

The above exemplary embodiments are provided to exemplify the techniques in the present disclosure, so that various changes, replacements, additions, omissions, and the like can be made within the scope of claims and equivalents thereof. Alternatively, the components described in the above exemplary embodiments may be combined to make an additional exemplary embodiment.

Overview of Exemplary Embodiments (1) A projector according to the present disclosure is configured to project image light generated by modulating light from a light source unit, and includes: a current measurement unit that measures a current supplied from a power supply, the current including at least a current supplied to a light source drive unit of the projector; and a controller that compares a measured current value measured by the current measurement unit with limit value information determined by user input or based on data stored in advance, and controls power output to the light source unit in accordance with a comparison result.

Measuring a current on an input side of the projector enables reducing a margin between a rated current and a drive current, so that a drive current of the light source unit can be increased as much as possible, and utilization efficiency of power supplied to the projector can be increased.

(2) The projector of (1) is configured such that the limit value information is a current threshold value.

(3) The projector of (1) or (2) includes a voltage measurement unit that measures a voltage supplied to the projector from a power supply, and the limit value information is a power threshold value. The controller calculates power of the projector from the measured current value and a measured voltage value measured by the voltage measurement unit, and compares the calculated power with the power threshold value, and then controls voltage output to the light source unit in accordance with a comparison result.

(4) The projector of (1) is configured such that the current measurement unit measures a current supplied from the power supply, the current also including a current supplied to a cooling unit of the projector.

(5) The projector of (3) is configured such that the controller determines a power factor based on the measured current value and the measured voltage value, and calculates active power of the projector based on the power factor, the measured current value, and the measured voltage value.

(6) The projector of (1) or (3) is configured such that when performing control to reduce power output to the light source unit, the controller does not perform control to increase the power output to the light source unit until a certain period elapses.

The present disclosure is applicable to a projector that projects image light generated by modulating light from a light source unit.

What is claimed is:

1. A projector configured to project image light generated by modulating light from a light source unit, the projector comprising:

a current measurement unit configured to measure an alternating current supplied from a power supply to obtain a measured alternating current value, the current including at least a current to be supplied to the light source unit of the projector;

a controller configured to compare the measured alternating current value measured by the current measurement unit with limit value information determined by user input or based on data stored in advance, and to control power output to the light source unit in accordance with a comparison result of the measured alternating current value and the limit value information; and a voltage measurement unit configured to measure a voltage supplied to the projector from the power supply to obtain a measured voltage value, wherein the limit value information is a power threshold value, and wherein the controller is further configured to calculate power of the projector from the measured alternating current value and the measured voltage value measured by the voltage measurement unit, and to compare the calculated power with the power threshold value, and then to control voltage output to the light source unit in accordance with a comparison result of the calculated power with the power threshold value.

2. The projector according to claim 1, wherein the limit value information is a current threshold value.

3. The projector according to claim 1, wherein the current measurement unit is configured to measure a current supplied from the power supply to a cooling unit of the projector.

4. The projector according to claim 1, wherein the controller is further configured to determine a power factor based on the measured alternating current value and the measured voltage value, and to calculate active power of the projector based on the power factor, the measured alternating current value, and the measured voltage value.

5. The projector according to claim 1, wherein the controller is further configured such that, after performing control to reduce power output to the light source unit, the controller does not perform control to increase the power output to the light source unit until a certain period elapses.

6. The projector according to claim 1, wherein the current measurement unit is further configured to measure a current effective value as the measured alternating current value by sampling a current waveform.

7. The projector according to claim 1, further comprising a light source controller configured to control power output to the light source, wherein the controller is configured to instruct the light source controller to reduce power output when the measured alternating current value is larger than the limit value information, and wherein the light source controller is configured to reduce an output power to the light source unit in accordance with the instruction from the controller.

8. A projector configured to project image light generated by modulating light from a light source unit, the projector comprising:

a current measurement unit configured to measure an alternating current supplied from a power supply to obtain a measured alternating current value, the current including at least a current to be supplied to the light source unit of the projector;

a controller configured to compare the measured alternating current value measured by the current measurement unit with limit value information determined by user input or based on data stored in advance, and to control power output to the light source unit in accordance with a comparison result of the measured alternating current value and the limit value information;

a light source controller configured to control power output to the light source; and a cooling controller configured to control power output to a cooling unit, wherein the current measurement unit is configured to measure a current supplied from the power supply to a cooling unit of the projector, wherein the controller is configured to instruct the light source controller and the cooling controller to respectively reduce power output when the measured alternating current value is larger than the limit value information, wherein the light source controller is configured to reduce an output power to the light source unit in accordance with the instruction from the controller, and wherein the cooling controller is configured to reduce an output power to the cooling unit in accordance with the instruction from the controller.

9. The projector according to claim 1, further comprising a power supply circuit configured to convert supplied AC power from the power supply into DC power and to output at least a part of the DC power to the light source unit.

* * * * *